(12) United States Patent
Schutz et al.

(10) Patent No.: US 7,763,147 B1
(45) Date of Patent: Jul. 27, 2010

(54) ARC SUPPRESSION PLATE FOR A PLASMA PROCESSING CHAMBER

(75) Inventors: Roger James Schutz, Kuna, ID (US); Mark Phillip Wright, Meridan, ID (US)

(73) Assignee: Lam Research Corporation, Fremont, CA (US)

( * ) Notice: Subject to any disclaimer, the term of this patent is extended or adjusted under 35 U.S.C. 154(b) by 828 days.

(21) Appl. No.: 11/434,971

(22) Filed: May 15, 2006

(51) Int. Cl.
*H01L 21/00* (2006.01)
*C23C 14/00* (2006.01)
*C23C 16/00* (2006.01)

(52) U.S. Cl. ............ 156/345.51; 156/345.52; 156/345.53; 118/728; 118/724; 118/725

(58) Field of Classification Search ............... 118/728, 118/724, 725; 156/345.51, 345.52, 345.53; 204/192.12, 298.15, 298.23; 264/483
See application file for complete search history.

(56) References Cited

U.S. PATENT DOCUMENTS

| | | | | |
|---|---|---|---|---|
| 5,213,349 A | * | 5/1993 | Elliott | 279/128 |
| 5,280,156 A | * | 1/1994 | Niori et al. | 219/385 |
| 5,529,657 A | * | 6/1996 | Ishii | 156/345.26 |
| 5,632,873 A | * | 5/1997 | Stevens et al. | 204/298.15 |
| 6,361,644 B1 | * | 3/2002 | Collins | 156/345.1 |
| 6,562,186 B1 | * | 5/2003 | Saito et al. | 156/345.24 |

* cited by examiner

*Primary Examiner*—Ram N. Kackar
(74) *Attorney, Agent, or Firm*—Martine Penilla & Gencarella, LLP

(57) ABSTRACT

A plasma processing chamber configured to generate a plasma is provided. The plasma processing chamber includes a substrate support assembly which includes a substrate support that is capable of supporting a substrate. The plasma processing chamber further includes a plate having a bottom surface and a top surface, and the plate is coupled to the plasma processing chamber. The plate further includes a plurality of countersunk regions for receiving a corresponding plurality of fasteners that enable coupling of the plate to the plasma processing chamber, and the plate has a lip that surrounds an outer region of the plate near the top surface of the plate. The substrate support is configured to be connected to the top surface of the plate. The plasma processing chamber further includes an isolation plate that surrounds the outer region of the plate, and the isolation plate includes a plurality of nipples and each of the plurality of nipples is configured to mate with the plurality of countersunk regions in the plate. The isolation plate is configured to fit in the lip of the plate that surrounds the outer region of the plate.

17 Claims, 5 Drawing Sheets

ARC SUPPRESSION PLATE FOR A PLASMA PROCESSING CHAMBER

BACKGROUND OF THE INVENTION

1. Field of the Invention

The present invention relates generally to the processing of semiconductor substrates, and more particularly, the suppression of current arcing near the substrate material.

2. Description of the Related Art

In the field of semiconductor processing, substrates are processed in plasma processing chambers by introducing a process gas into the reaction chamber of the plasma processing chamber and exciting the gas to a plasma state with the application of a radio frequency (RF) field.

The semiconductor substrates are commonly held in place on a substrate support within the reaction chambers using devices such as mechanical clamps or electrostatic clamps (ESC). Process gases are introduced into the chamber using various methods, one method being the use of a gas distribution plate (GDP) mounted at the top of an etching chamber. To excite the gas to a plasma state an RF field is applied to the process gas via electrodes using techniques such as transformer coupled plasma (TCP), also called inductively coupled plasma (ICP), and electron-cyclotron resonance (ECR).

Because of the high power used to generate the RF field and the requirement that an even plasma field is generated to provide consistent formation of high aspect ratio features on the entire substrate, it is highly desirable that current within the chamber follow a path to ground. Drawing current from the reaction chamber toward the grounded body of the plasma processing chamber wall is an example of a preferred path to ground presently being used. Current not following the desired path to ground and arcing near the substrate can create disturbances in the plasma which is detrimental to forming uniform features on the entire substrate and can result in reduced yields.

Concurrent with the need to suppress arcing of current near the substrate surface is the need to allow access for regular maintenance of the components within the plasma processing chamber. The particle and by-product producing nature of the processing that occurs within the reaction chamber requires periodic cleaning and replacement of worn or damaged components. Minimizing the time required for cleaning and maintenance means there can be maximum output from the plasma processing chamber.

Aluminum and aluminum alloys are typically used for walls, electrodes, fasteners and other components of the reaction chamber. To minimize the possibility of undesirable stray arcing near the substrate, materials with high dielectric properties such as ceramics and quartz are used to isolate metal components.

Because of the brittle nature of ceramics and quartz, screw covers made from those materials cannot completely electrically isolate countersunk fasteners without making the fasteners unserviceable or requiring the breaking of the screw cover to access the fasteners. A typical solution is to use quartz screw covers which have an outside diameter small enough so the screw cover cannot become wedged in the countersink. This solution allows access to the underlying fasteners however, the loose fit of the screw cover means they can be displaced during cleaning of the chamber either by getting blown from the countersink with compressed clean dry air or pulled out of the countersink and into a vacuum cleaner.

Both problems require locating and replacing the screw covers which can lead to prolonged downtime of the plasma processing chamber and increased maintenance costs. Additionally, the loose fit between the screw covers and countersink can promote an alternate path to ground via the metallic fastener within the countersink. Current not following the intended path to ground near the substrate has the potential to create arcing that would disturb the plasma and result in non-uniform etching.

In view of the forgoing, there is a need for improved isolation to suppress stray arcing within the etching chamber while also reducing chamber downtime due to parts being lost during regular maintenance.

SUMMARY

In one embodiment, a plasma processing chamber configured to generate a plasma is provided. The plasma processing chamber includes a substrate support assembly which includes a substrate support that is capable of supporting a substrate. The plasma processing chamber further includes a plate having a bottom surface and a top surface, and the plate is coupled to the plasma processing chamber. The plate further includes a plurality of countersunk regions for receiving a corresponding plurality of fasteners that enable coupling of the plate to the plasma processing chamber, and the plate has a lip that surrounds an outer region of the plate near the top surface of the plate. The substrate support is configured to be connected to the top surface of the plate. The plasma processing chamber further includes an isolation plate that surrounds the outer region of the plate, and the isolation plate includes a plurality of nipples and each of the plurality of nipples is configured to mate with the plurality of countersunk regions in the plate. The isolation plate is configured to fit in the lip of the plate that surrounds the outer region of the plate.

In another embodiment, a plasma processing chamber configured to generate a plasma is provided. The plasma processing chamber includes a substrate support assembly having a substrate support that is capable of supporting a substrate. A method of making plates for use in the plasma processing chamber are provided. The method includes generating a plate having a bottom surface and a top surface, and the plate is configured to be coupled to the plasma processing chamber. The plate generating includes forming a plurality of countersunk regions in the plate for receiving a corresponding plurality of fasteners that enable coupling of the plate to the plasma processing chamber. Also included is forming a lip in the plate that surrounds an outer region of the plate near the top surface of the plate, and the substrate support is configured to be connected to the top surface of the plate. The method further includes generating an isolation plate that surrounds the outer region of the plate. The generating of the isolation plate includes forming a plurality of nipples on the isolation plate so that each of the plurality of nipples is capable of mating with the plurality of countersunk regions in the plate. The isolation plate is configured to fit in the lip of the plate that surrounds the outer region of the plate.

In yet another embodiment, a device for plasma processing semiconductor substrates is provided. The device for plasma processing semiconductors includes a housing which defines a plasma processing chamber. The plasma processing chamber is defined by a reaction chamber composed of chamber walls, a base, and an upper chamber. The device for plasma processing semiconductor substrates also includes a system which introduces gas into the reaction chamber, and a system which extracts gas and reaction products from the reaction chamber. Also included in the plasma processing chamber is a substrate support that includes an electrode, and an assembly which includes a substrate support that is capable of supporting a substrate. The plasma processing chamber further includes a plate having a bottom surface and a top surface, and the plate is coupled to the plasma processing chamber. The plate further includes a plurality of countersunk regions for receiving a corresponding plurality of fasteners that enable coupling of the plate to the plasma processing chamber, and the plate has a lip that surrounds an outer region of the plate near the top surface of the plate. The substrate support is configured to be connected to the top surface of the plate. The plasma processing chamber further includes an isolation plate that surrounds the outer region of the plate, and the isolation plate includes a plurality of nipples and each of the plurality of nipples is configured to mate with the plurality of countersunk regions in the plate. The isolation plate is configured to fit in the lip of the plate that surrounds the outer region of the plate.

Other aspects and advantages of the invention will become apparent from the following detailed description, taken in conjunction with the accompanying drawings, illustrating by way of example the principles of the invention.

BRIEF DESCRIPTION OF THE DRAWINGS

The invention, together with further advantages thereof, may best be understood by reference to the following description taken in conjunction with the accompanying drawings.

DETAILED DESCRIPTION

An invention is disclosed for suppressing arcing near a semiconductor substrate during plasma processing and structures for enabling the same. In the following description, numerous specific details are set forth in order to provide a thorough understanding of the present invention. It will be apparent, however, to one skilled in the art that the present invention may be practiced without some or all of these specific details. In other instances, well known process steps have not been described in detail in order not to unnecessarily obscure the present invention.

Figure 1:
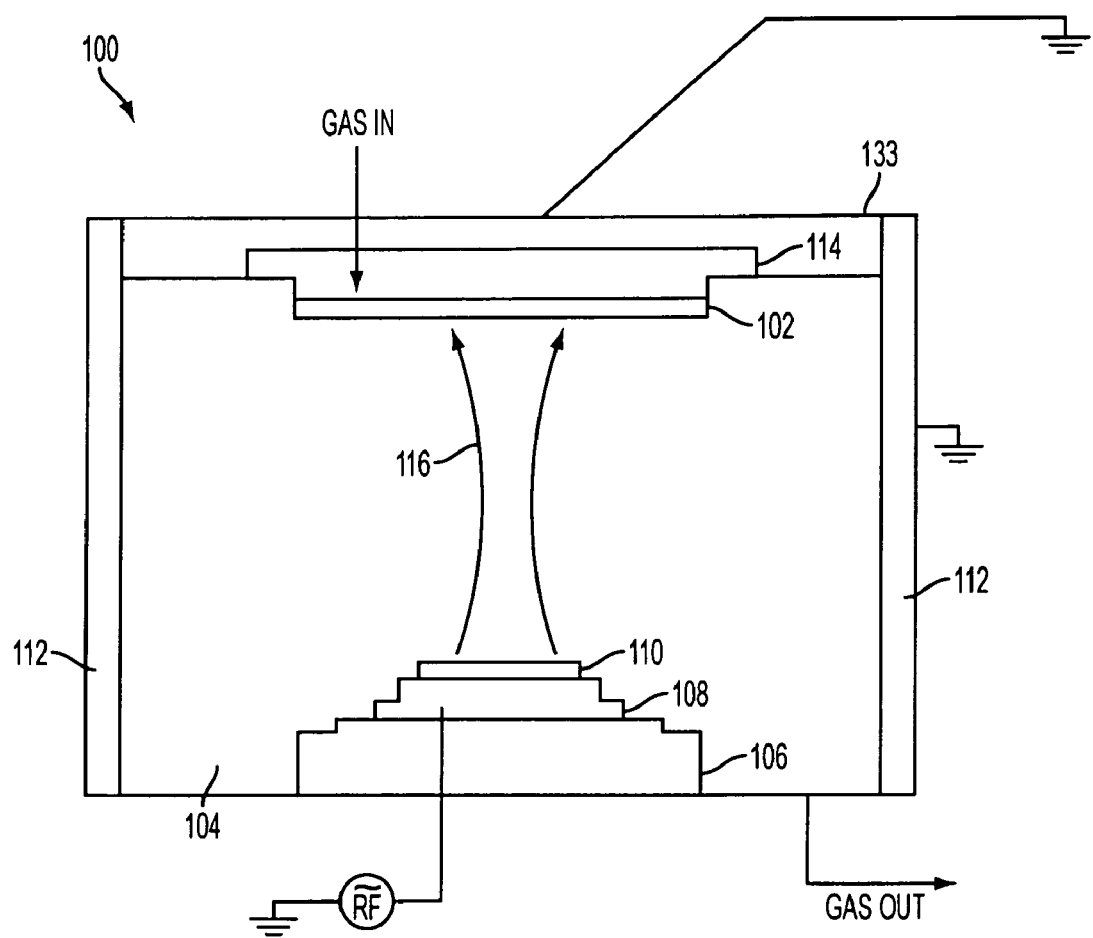
FIG. 1 is a cross-sectional view of a plasma system, in accordance with one embodiment of the present invention.

FIG. 1 is a cross-sectional view of a plasma processing chamber 100, in accordance with one embodiment of the present invention. The plasma processing chamber 100 includes a reaction chamber 104 having a grounded chamber wall 112. As shown, the grounded chamber wall 112 defines the outer body of the plasma processing chamber 100. The plasma processing chamber 100, although shown as a single system, can be part of a cluster of tools that are used in the processing of semiconductor wafers. A gas distribution plate 102 is positioned above the substrate support 108 and the gas distribution plate 102 is attached to the top plate 114. The top plate 114 is attached to the upper chamber 133.

During processing, a semiconductor substrate 110 is moved into the reaction chamber 104 and placed on substrate support 108. Substrate support 108 is connected to a plate 106. The plate 106 is connected to the base of the reaction chamber 104. Process gases are introduced to the reaction chamber 104 by a gas supply system (not shown). Plasma is generated by exciting the process gases to the plasma state by applying RF power to the substrate support 108. During plasma generation, current is generated within reaction chamber 104. A path to ground must be maintained during processing, and in one embodiment, the path to ground preferably follows the path 116, which draws current toward the gas distribution plate 102.

After a certain number of processing operations are completed, the reaction chamber 104 is subjected to cleaning. Such cleaning routines enable service engineers to remove reaction products and unreacted plasma species from the reaction chamber. Vacuum and other applications of clean dry air are used during the cleaning operations.

Figure 2:
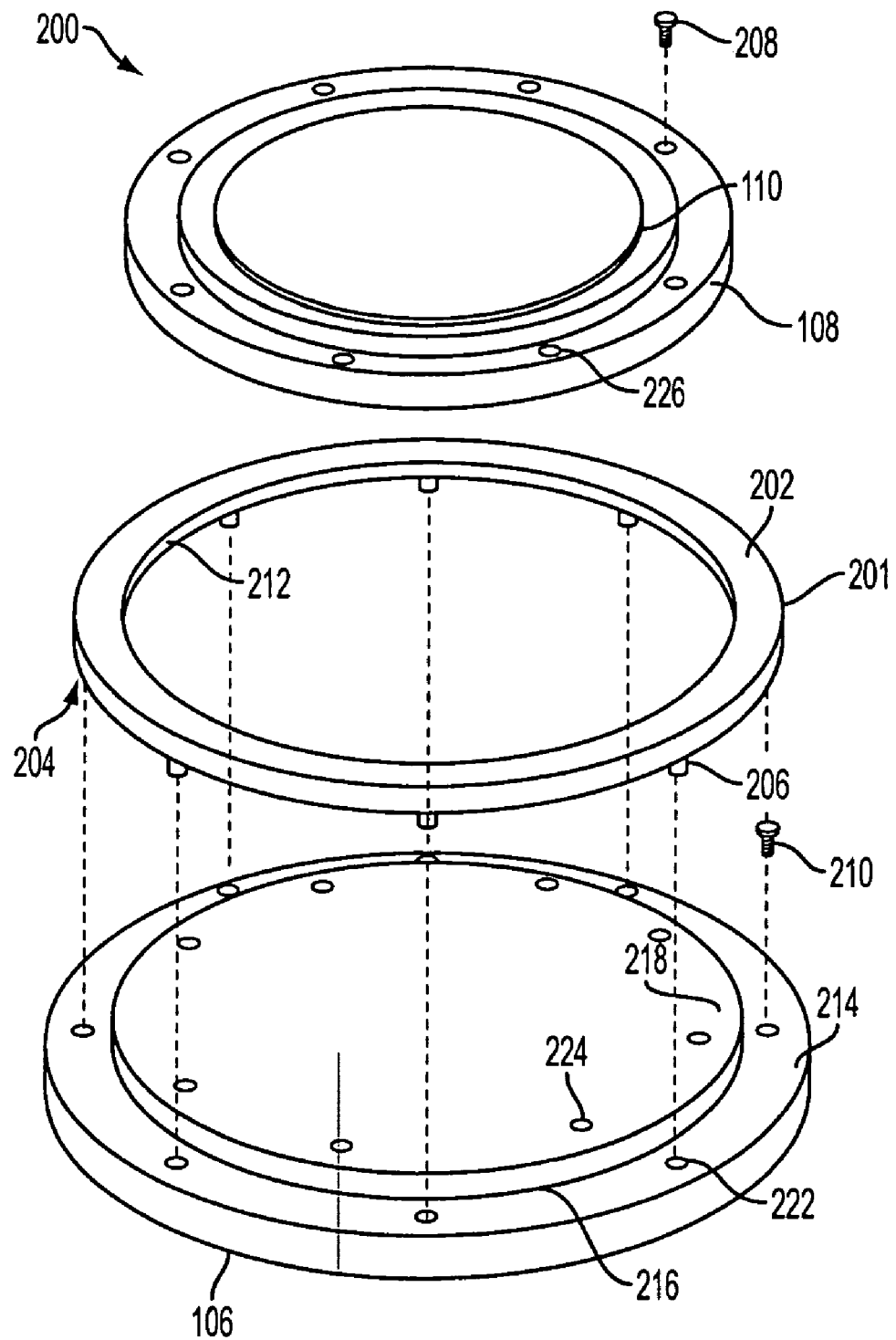
FIG. 2 illustrates an exploded view of a substrate support assembly, in accordance with one embodiment of the present invention.

FIG. 2 illustrates an exploded view of a substrate support assembly 200, in accordance with one embodiment of the present invention. A plate 106 is shown as the bottom most piece of the substrate support assembly 200. The plate 106 is in one embodiment made from a ceramic material. As noted above, the plate 106 is configured to be connected to a base of the reaction chamber 104. In one embodiment, the plate 106 is machined in a substantially circular form that resembles a disk. This shape is used when the substrate to be processed is substantially circular, as are semiconductor wafers. If the substrate is of a different geometric configuration, the plate 106 could be specifically shaped to accommodate the desired implementation. In this view, a lip 216 is defined between a transition from a top surface 218 and a bottom surface lip 214. A plurality of countersunk regions 222 with corresponding through holes are formed in the plate 106. The countersunk regions 222 are preferably drilled or formed to a depth that will accept appropriate fasteners 210. Fasteners 210, in one embodiment, are machine screws or bolts that enable securing the plate 106 to the base of the reaction chamber 104. The top surface 218 also includes a plurality of threaded holes 224.

Continuing with the exploded view of FIG. 2, an isolation plate 201 is defined in the form of a ring. The isolation plate 201 has a top side 202 and a nipple side 204. The nipple side 204 will include a plurality of nipples 206. The nipples 206 are configured in such a dimension so that they fit into the countersunk regions 222 defined in the plate 106. Preferably, the isolation plate 201 will fit over the bottom surface lip 214 in an orientation that is adjacent to the lip 216. When the isolation plate 201 is placed over the plate 106, the fasteners 210 should be installed and acting to secure the plate 106 to the base of the reaction chamber 104. As will be described below, the isolation plate 201 will enable isolation of the fasteners 210 from the plasmas formed within the reaction chamber 104 during processing. Additionally, the isolation plate 201 will be secured over the bottom surface lip 214 in such a way that the nipples 206 are well retained within the countersunk regions 222. Such isolation provided by the isolation plate 201 will also benefit plasma processing, as the nipples 206 of the isolation plate 201 and the body of the isolation plate 201 will substantially inhibit unwanted paths to ground through the fasteners 210. Such paths, if formed, may produce arcing. However, the isolation plate 201 with its nipples 206 will serve to minimize the possibility of allowing such ground paths in the vicinity of a semiconductor substrate being processed.

Dimensionally, the isolation plate 201 is made to a size that is needed in the particular implementation. For instance, if semiconductor wafers are the subject of processing, the isolation plate 201 can take on a number of sizes depending on the chamber size and the wafer size. For example purposes only, if the wafer is a 300 mm wafer, the isolation plate 201 may have an outside diameter of about 350 mm, and the inside diameter is about 325 mm. Also, in this example, the thickness of the isolation plate 201 is about 4 mm, the extension of the nipples 206 away from the nipple side 204 of the isolation plate 201 is about 2 mm, and the diameter of the nipples 206 is about 10 mm.

The substrate support assembly 200 also includes a substrate support 108 that connects to the top surface 218 of the plate 106. Fasteners or some type of screws are used to connect the substrate support 108 to the plate 106 using the threaded holes 224. A semiconductor substrate 110 will thus sit on the substrate support 108 when processing in the reaction chamber 104 is desired.

Figure 3:
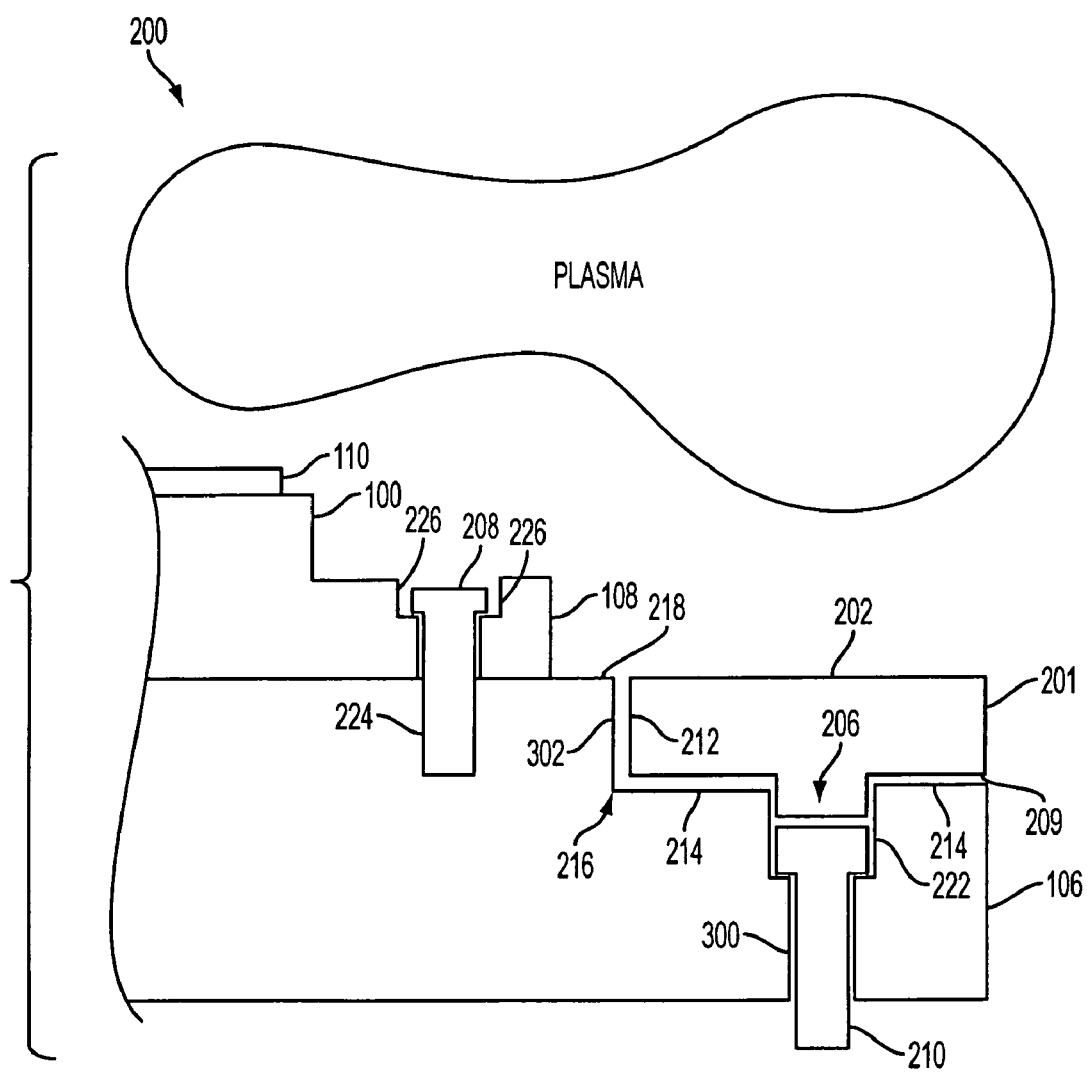
FIG. 3 is a cross-sectional view of the substrate support assembly, in accordance with one embodiment of the present invention.

FIG. 3 is a cross-sectional view of the substrate support assembly 200 in accordance with one embodiment of the present invention. Substrate support 108 has a plurality of countersunk regions 226 with corresponding through holes that align with the threaded holes 224 on the top surface 218 of the plate 106. A corresponding plurality of fasteners 208 installed in the countersunk regions 226 secure the substrate support 108 to the plate 106. In one embodiment substrate support 108 is an electrostatic clamp (ESC) designed to hold the semiconductor substrate 110 during processing.

The semiconductor substrate 110 is processed by the production of plasma within the reaction chamber 104. The plasma intensity is dependent on many factors and it is important to maintain a consistent plasma intensity to obtain optimum processing. Decreased plasma intensity can result in decreased and thus incomplete processing. Increased plasma intensity can cause over processing and plasma induced damage to features being formed on the semiconductor substrates. Predictable removal of current generated within the reaction chamber 104 during plasma generation is one factor that determines the consistency of the plasma intensity. In one embodiment current is removed from the reaction chamber 104 along the preferred path to ground 116. Current finding an alternate path to ground near the semiconductor substrate 110 can result in arcing which results in inconsistent plasma intensity and less that optimum processing of semiconductor substrates. One example of an alternate path to ground near the semiconductor substrate 110 is found between substrate support 108 and fastener 210.

The isolation plate 201 is intended to suppress the alternate path to ground by isolating substrate support 108 and fastener 210. In one embodiment the nipple side 204 rests against the bottom lip surface 214 while the inside 212 is at least partially in contact with the sidewall lip 302 and the nipple 206 extends at least partially inside countersunk region 222. The topside 202 of the previously mentioned embodiment is substantially flush with top surface 218. Of course, other embodiments may be formed such that the topside 202 may not be aligned with the top surface 218. The embodiment of the isolation plate 201 will thus assist in suppressing the alternate path to ground between substrate support 108 and fastener 210 by increasing the physical distance current would need to arc across. Fabricating the isolation plate 201 from a non-conductive material such as ceramic further enhances the ability to suppress alternate paths to ground between substrate support 108 an fastener 210.

Continuing with FIG. 3, cleaning the reaction chamber 104 and substrate support system 200 includes displacing residue by blowing in clean dry air and using a vacuum cleaner to remove the residue. The isolation plate 201 is prevented from becoming dislodged from the plate 106 when clean dry air is blown into the reaction chamber 104 because the nipples 206 are well retained within the countersunk regions 222. Additionally, the isolation plate 201 is prevented from being pulled into a vacuum cleaner during vacuuming of the reaction chamber 104 because the physical dimensions of the isolation plate 201 prevent the isolation plate 210 from fitting within the vacuum cleaner nozzle.

Figure 4:
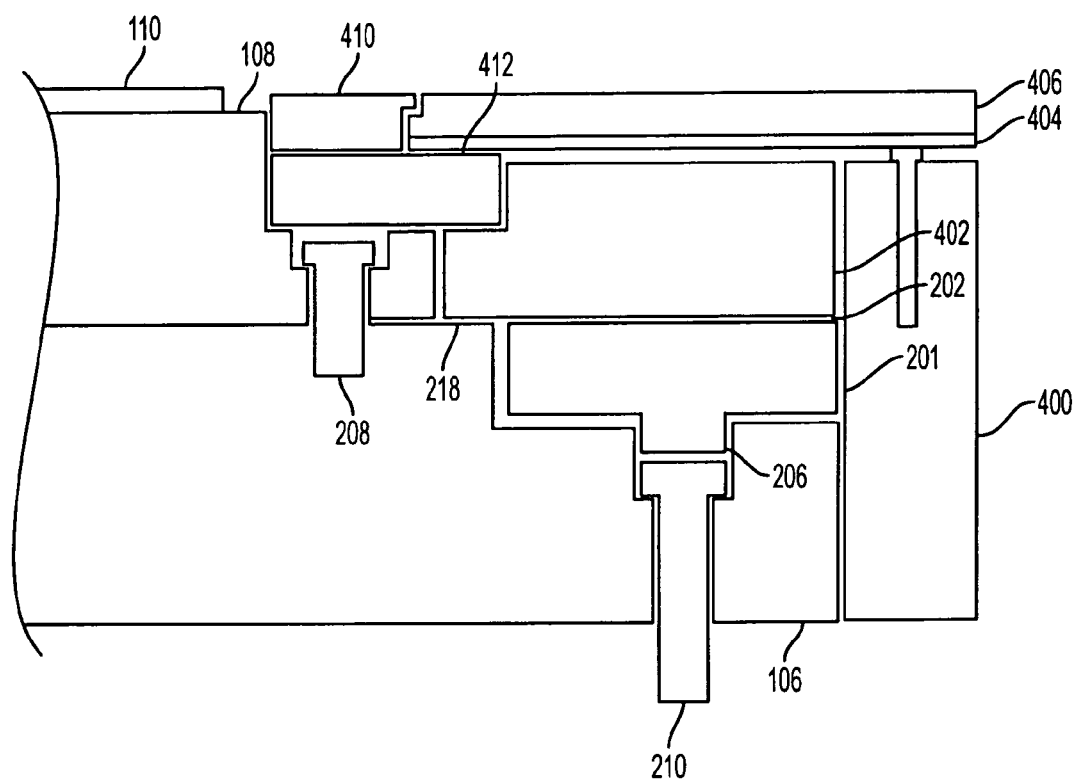
FIG. 4 is a cross-sectional view of the substrate support system and other components near the semiconductor substrate, in accordance with one embodiment of the present invention.

FIG. 4 is a cross-sectional view of the substrate support system 200 and other finishing components near the semiconductor substrate 110. The finishing components described below are provided to complete the substrate support assembly. In some instances, these finishing components may be modified, certain pieces excluded and in other instances other component pieces added. The size, orientation, and material make up of the finishing components may vary, so long as a functional substrate support assembly is provided and the assembly enables efficient process control when substrates are processed within a reaction chamber.

Continuing with the description of FIG. 4, the plate 106 is connected to the bottom of the reaction chamber 104 using a plurality of fasteners 210. The substrate support 108 is connected to the plate 106 using a plurality of fasteners 208. The isolation plate 201 rests on the plate 106 with the nipple 206 covering the fasteners 210 and the topside 202 substantially flush with the top surface 218. The quartz plate 402 rests on the isolation plate 201 and the top surface 218. In one embodiment, the top of the quartz plate 402 is below the top of the substrate support 108. The quartz plate 402 has a lip feature to accommodate the quartz plate 412. The quartz plate 412 rests on the substrate support 108 and meshes with the feature of the quartz plate 402. The top of quartz plate 412 is substantially flush with the top of the quartz plate 402.

Continuing with FIG. 4, an aluminum wall 400 is in contact with the base of the reaction chamber 104 and abuts the outer edge of the plate 106. In this example, the aluminum wall 400 does not contact the chamber wall 112 and is configured to be about the same height as the combination of the plate 106 and the quartz plate 402. The aluminum plate 404 is secured to the aluminum wall 400 and substantially fully covers the quartz plate 402 and at least partially covers the quartz plate 412. The quartz plate 406 rests on top of the aluminum plate 404. The quartz plate 406 has a mating feature to mesh with a corresponding feature on the quartz plate 410 and the top of the quartz plate 406 is substantially flush with the top of the semiconductor substrate 110. The quartz plate 410 rests on the quartz plate 412 and contains feature that meshes with the feature on the quartz plate 406. In this example, the top of the quartz plate 410 is substantially flush with the top of the semiconductor substrate 110.

Figure 5:
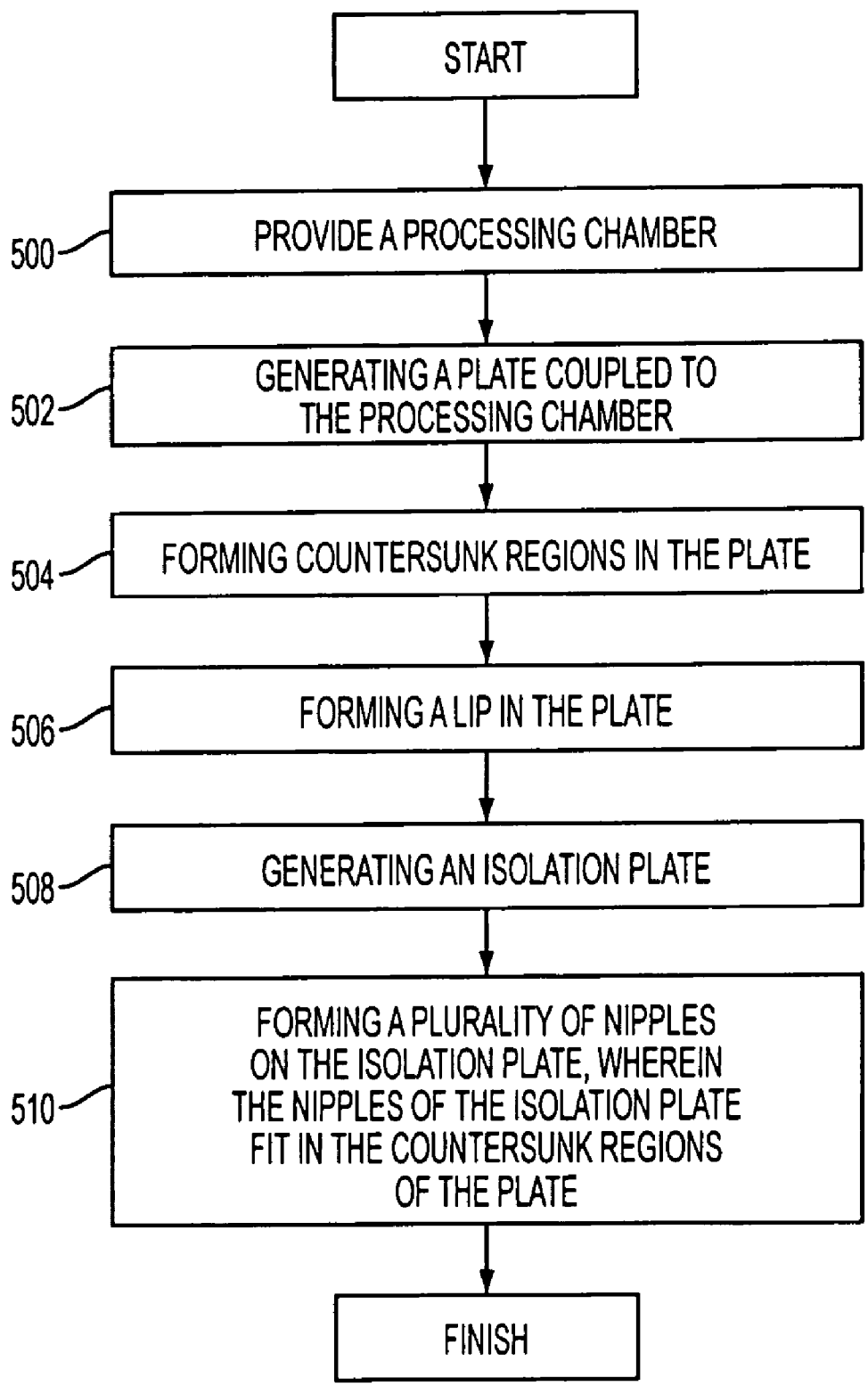
FIG. 5 is a flow diagram illustrating the method of forming and using an isolation plate, in accordance with one embodiment of the present invention.

FIG. 5 is a flow diagram illustrating the method of making the isolation plate 201 for use in the plasma processing chamber 100. The manufacturing techniques and materials used to generate and form the components listed below are provided to demonstrate possible methods of making the isolation plate 201. There are numerous manufacturing techniques and materials and those embodied below should not be considered inclusive of the methods capable of forming the isolation plate 201.

In operation 500 the plasma processing chamber 100 is provided. Operation 502 generates a plate 106 that will be coupled to the plasma processing chamber 100 at the base of the reaction chamber 104. In one embodiment the plate 106 is composed of a ceramic material and is formed using manufacturing techniques know to those skilled in the art. Additionally, one manufacturing technique to form the plate 106 is casting. Operation 504 forms a plurality of countersunk regions 222 in the plate 106. The countersunk regions 222 may be formed by a variety of machining techniques including drilling or may be formed during the casting of the plate 106.

Operation 506 forms the lip 216 in the plate 106. The lip 216 is defined by the sidewall lip 302 and the bottom lip surface 214. Formation of the lip can occur when the plate 106 is cast or formed using machining techniques know to those skilled in the art. Operation 508 generates the isolation plate 201. One embodiment of the isolation plate 201 is formed from a non-conductive material such as ceramic using techniques known to those skilled in the art of ceramic fabrication. Other suitable materials may also work, so long as they are compatible within the reaction chamber 104. Finally, operation 510 forms a plurality of nipples 206 on the isolation plate 201. In one embodiment the nipples are formed during the casting of the isolation plate 201. In another embodiment the nipples can be formed by removing excess material from the nipple side 204. In still another embodiment, the nipples can be attached to the isolation plate 201 with suitable attachment methods, such as by the use of screws, or forming nipples that are in the form of threaded extensions that fit into threaded holes formed in the isolation plate 201. Consequently, the example method operations should not be considered as a complete listing of possible fabrication routines, but simply as illustrative of one or more ways of completing the operations.

Although the foregoing invention has been described in some detail for purposes of clarity of understanding, it will be apparent that certain changes and modifications may be practiced within the scope of the appended claims. For instance, although discussion has been made regarding a single processing chamber, it should be understood that the processing chamber can be part of a larger cluster system, that is made up of multiple units. Accordingly, the present embodiments are to be considered as illustrative and not restrictive, and the invention is not to be limited to the details given herein, but may be modified within the scope and equivalents of the appended claims.

What is claimed is:

1. A plasma processing chamber configured to generate a plasma, the plasma processing chamber including a substrate support assembly including a substrate support that is capable of supporting a substrate, the substrate support assembly, comprising:

a plate having a bottom surface and a top surface, the plate being coupled to the plasma processing chamber, the plate including a plurality of countersunk regions for receiving a corresponding plurality of fasteners that enable coupling of the plate to the plasma processing chamber, and the plate including a lip that surrounds an outer region of the plate near the top surface of the plate, and the substrate support is configured to be connected to the top surface of the plate; and an isolation plate that surrounds the outer region of the plate, the isolation plate including a plurality of nipples and each of the plurality of nipples is configured to mate with and be retained within the plurality of countersunk regions in the plate;

wherein the isolation plate is configured to fit in the lip of the plate that surrounds the outer region of the plate;

wherein the bottom surface of the plate is directly connected to a base of the plasma processing chamber, the fasteners being in contact with the plasma processing chamber.

2. The plasma processing chamber as recited in claim 1, wherein the plate and the isolation plate are substantially circular.

3. The plasma processing chamber as recited in claim 1, wherein the isolation plate is defined in a ring shape, and the nipples extend out from one of either a top surface of the ring shape or a bottom surface of the ring shape.

4. The plasma processing chamber as recited in claim 1, wherein each of the plurality of nipples that mate with the plurality of countersunk regions in the plate extend at least partially into corresponding ones of the plurality of countersunk regions.

5. The plasma processing chamber as recited in claim 4, wherein the plurality of nipples isolate the plurality of fasteners from the plasma so as to reduce a ground path for the plasma through the plurality of fasteners.

6. The plasma processing chamber as recited in claim 1, wherein the lip that surrounds an outer region of the plate near the top surface of the plate is defined by a side wall lip and a bottom surface lip, such that the side wall lip is integrally formed with the bottom surface lip, and the bottom surface lip includes the plurality of countersunk regions that receive the plurality of nipples.

7. The plasma processing chamber as recited in claim 6, wherein the isolation plate has a top side and a nipple side, the nipple side includes the plurality of nipples and a bottom side, the bottom side is configured to join with the bottom surface lip of the plate.

8. The plasma processing chamber as recited in claim 1, wherein the plate and the isolation plate is defined from a ceramic and the fasteners are defined from a metal.

9. The plasma processing chamber as recited in claim 1, wherein the plate and the isolation plate are defined from a ceramic and the fasteners are defined from a metal.

10. The plasma processing chamber as recited in claim 1, wherein a top surface of the isolation plate is substantially flush with the top surface of the plate.

11. A device for plasma processing semiconductor substrates comprising:

a housing which defines a plasma processing chamber including;

a reaction chamber defined by; a chamber walls; a base; and an upper chamber; a system which introduces gas into the reaction chamber; a system which extracts gas and reaction products from the reaction chamber; and a substrate support assembly including a substrate support within the reaction chamber including;

an electrode; a plate having a bottom surface and a top surface, the plate being coupled to the base of the reaction chamber, the plate including a plurality of countersunk regions for receiving a corresponding plurality of fasteners that enable coupling of the plate to the base of the reaction chamber, and the plate including a lip that surrounds an outer region of the plate near the top surface of the plate, and the substrate support is configured to be connected to the top surface of the plate; and an isolation plate that surrounds the outer region of the plate, the isolation ring including a plurality of nipples and each of the plurality of nipples is configured to mate with and be retained within the plurality of countersunk regions in the plate;

wherein the isolation plate is configured to fit in the lip of the plate that surrounds the outer region of the plate;

wherein the bottom surface of the plate is directly connected to a base of the plasma processing chamber, the fasteners being in contact with the plasma processing chamber.

12. The device for processing semiconductor substrates as recited in claim 11, wherein the electrode is connected to a matching network and an RF power supply.

13. The device for processing semiconductor substrates as recited in claim 11, wherein a preferred path to ground for current generated within the reaction chamber flows from the base toward the upper chamber.

14. The device for processing semiconductor substrates as recited in claim 11, wherein a top surface of the isolation plate is substantially flush with the top surface of the plate.

15. A plasma processing chamber having a substrate support assembly, comprising:

a substrate support being capable of supporting a substrate;

a plate having a bottom surface and a top surface, the plate having a plurality of countersunk regions to receive a corresponding plurality of fasteners that enable the plate to be coupled to the plasma processing chamber, the plate further including a lip that surrounds an outer region of the plate near the top surface of the plate, the substrate support being configured to be connected to the top surface of the plate; and an isolation plate that surrounds the outer region of the plate, the isolation plate including a plurality of nipples and each of the plurality of nipples being configured to mate with and be retained within the plurality of countersunk regions in the plate;

wherein the isolation plate is configured to fit in the lip of the plate that surrounds the outer region of the plate;

wherein the bottom surface of the plate is directly connected to a base of the plasma processing chamber, the fasteners being in contact with the plasma processing chamber.

16. A plasma processing chamber as recited in claim 15, wherein each of the plurality of nipples that mate with the plurality of countersunk regions in the plate extend at least partially into corresponding ones of the plurality of countersunk regions.

17. The plasma processing chamber as recited in claim 16, wherein the plurality of nipples isolate the plurality of fasteners from the plasma so as to reduce a ground path for the plasma through the plurality of fasteners.

* * * * *